(12) United States Patent
Feng et al.

(10) Patent No.: US 11,436,961 B2
(45) Date of Patent: Sep. 6, 2022

(54) SHIFT REGISTER AND METHOD OF DRIVING THE SAME, GATE DRIVING CIRCUIT AND DISPLAY PANEL

(71) Applicants: HEFEI BOE JOINT TECHNOLOGY CO., LTD., Hefei (CN); BOE TECHNOLOGY GROUP CO., LTD., Beijing (CN)

(72) Inventors: Xuehuan Feng, Beijing (CN); Yongqian Li, Beijing (CN)

(73) Assignees: HEFEI BOE JOINT TECHNOLOGY CO., LTD., Anhui (CN); BEIJING BOE TECHNOLOGY DEVELOPMENT CO., LTD., Beijing (CN)

(*) Notice: Subject to any disclaimer, the term of this patent is extended or adjusted under 35 U.S.C. 154(b) by 0 days.

(21) Appl. No.: 17/005,987

(22) Filed: Aug. 28, 2020

(65) Prior Publication Data

US 2021/0065603 A1 Mar. 4, 2021

(30) Foreign Application Priority Data

Aug. 30, 2019 (CN) .......................... 201910818456.1

(51) Int. Cl.
*G06F 1/26* (2006.01)
*G09G 3/3233* (2016.01)
(Continued)

(52) U.S. Cl.
CPC ............... *G09G 3/20* (2013.01); *G11C 19/28* (2013.01); *G09G 2300/0426* (2013.01);
(Continued)

(58) Field of Classification Search
CPC ............ G09G 3/20; G09G 2300/0426; G09G 2310/0267–0286; G09G 2310/08; G09G 2330/02–04; G11C 19/28
See application file for complete search history.

(56) References Cited

U.S. PATENT DOCUMENTS

| 10,825,539 B2 | 11/2020 | Feng et al. | |
| 2015/0036784 A1* | 2/2015 | Qing | G09G 3/3208 |
| | | | 377/68 |

(Continued)

FOREIGN PATENT DOCUMENTS

| CN | 102779478 A | * 10/2012 | ............. G11C 19/28 |
| CN | 106157867 A | * 11/2016 | ............. G11C 19/28 |

(Continued)

OTHER PUBLICATIONS

First Chinese Office Action dated Jun. 28, 2020, received for corresponding Chinese Application No. 201910818456.1, 25 pages.

*Primary Examiner* — Lin Li
(74) *Attorney, Agent, or Firm* — Kinney & Lange, P.A.

(57) ABSTRACT

A shift register and a method of driving the same, a gate driving circuit, and a display panel are disclosed. The shift register includes a display control circuit coupled to a pull-up node, a first power supply and a first control terminal respectively; a cascade output circuit coupled to a second clock terminal, the pull-up node and a cascade output terminal; a sensing control circuit coupled to the pull-up node, the cascade output terminal, a second control terminal and a third control terminal respectively; and a signal output circuit coupled to the pull-up node, a first clock terminal and a signal output terminal.

20 Claims, 6 Drawing Sheets

(51) Int. Cl.
*G09G 3/36* (2006.01)
*G11C 19/28* (2006.01)
*G09G 3/20* (2006.01)

(52) U.S. Cl.
CPC ............... *G09G 2310/0267* (2013.01); *G09G 2310/0286* (2013.01); *G09G 2310/08* (2013.01); *G09G 2330/02* (2013.01); *G09G 2330/04* (2013.01)

(56) References Cited

U.S. PATENT DOCUMENTS

| | | | |
|---|---|---|---|
| 2015/0317954 A1* | 11/2015 | Jang | G09G 3/3677 345/82 |
| 2016/0217728 A1* | 7/2016 | In | G09G 3/2096 |
| 2018/0366046 A1 | 12/2018 | Lin et al. | |
| 2018/0366067 A1* | 12/2018 | Jang | G09G 3/3677 |
| 2019/0180691 A1* | 6/2019 | Takasugi | G09G 3/3233 |
| 2020/0090570 A1* | 3/2020 | Feng | G11C 19/28 |
| 2020/0135286 A1* | 4/2020 | Li | G09G 3/3677 |

FOREIGN PATENT DOCUMENTS

| | | | | |
|---|---|---|---|---|
| CN | 108648718 A | * | 10/2018 | ............ G11C 19/28 |
| CN | 108682397 A | | 10/2018 | |
| CN | 108682398 A | | 10/2018 | |
| CN | 109935198 A | | 6/2019 | |
| CN | 109935269 A | | 6/2019 | |
| CN | 106409200 B | * | 1/2020 | ............ G06F 1/263 |
| KR | 20170078978 A | | 7/2017 | |
| KR | 20180072269 A | | 6/2018 | |

* cited by examiner

SHIFT REGISTER AND METHOD OF DRIVING THE SAME, GATE DRIVING CIRCUIT AND DISPLAY PANEL

CROSS-REFERENCE TO RELATED APPLICATION(S)

This application claims priority to Chinese Patent Application No. 201910818456.1, filed on Aug. 30, 2019, which is incorporated herein by reference in its entirety.

TECHNICAL FIELD

The present disclosure relates to the field of display technology, and more particularly, to a shift register and a method of driving the same, a gate driving circuit and a display panel.

BACKGROUND

In the field of display technology, gate driving circuits are generally used to reduce costs. In the related technology, it is very difficult for an Organic Light Emitting Diode (OLED) gate driving circuit to display and compensate for two waveforms with different cycles and different pulse widths. In addition, the output waveforms are complex, and the required structure of the circuit is also very complex.

SUMMARY

The present disclosure aims to solve one of the technical problems in related technology at least to a certain extent.

According to a first aspect of the embodiments of the present disclosure, there is proposed a shift register, comprising: a display control circuit coupled to a pull-up node, a first power supply and a first control terminal respectively, and configured to write a level provided at the first power supply into the pull-up node under control of a first control signal at the first control terminal in a display mode; a signal output circuit coupled to the pull-up node, a first clock terminal and a signal output terminal, and configured to control the signal output terminal to output a gate driving signal or a sensing driving signal according to a level at the pull-up node and a first clock signal at the first clock terminal; a cascade output circuit coupled to a second clock terminal, the pull-up node and a cascade output terminal, and configured to control the cascade output terminal to output a cascade control signal according to the level at the pull-up node and a second clock signal at the second clock terminal; and a sensing control circuit coupled to the pull-up node, the cascade output terminal, a second control terminal, and a third control terminal, respectively, and configured to control a level at a holding node according to a second control signal at the second control terminal and the cascade control signal at the cascade output terminal in the display mode, and control the level at the pull-up node according to the level at the holding node and a third control signal at the third control terminal in a sensing mode.

According to an embodiment of the present disclosure, the sensing control circuit comprises: a sensing input subcircuit coupled to the cascade output terminal, the holding node and the second control terminal respectively, and configured to control the level at the holding node according to the second control signal at the second control terminal and the cascade control signal at the cascade output terminal in the display mode; and a sensing pull-up subcircuit coupled to the pull-up node, the holding node and the third control terminal respectively, and configured to control the level at the pull-up node according to the level at the holding node and the third control signal at the third control terminal in the sensing mode.

According to an embodiment of the present disclosure, the sensing input subcircuit comprises: a first transistor having a first electrode coupled to the cascade output terminal, and a control electrode coupled to the second control terminal; a second transistor having a first electrode coupled to a second electrode of the first transistor, a second electrode coupled to the holding node, and a control electrode coupled to the second control terminal; and a first capacitor having a first end coupled to the holding node, and a second end coupled to a second power supply.

According to an embodiment of the present disclosure, the sensing pull-up subcircuit comprises: a third transistor having a first electrode coupled to the third control terminal, and a control electrode coupled to the holding node; a fourth transistor having a first electrode coupled to a second electrode of the third transistor, and a control electrode coupled to the first electrode of the fourth transistor; and a fifth transistor having a first electrode coupled to a second electrode of the fourth transistor, a control electrode coupled to the third control terminal, and a second electrode coupled to the pull-up node.

According to an embodiment of the present disclosure, the sensing pull-up subcircuit comprises: a third transistor having a first electrode coupled to the holding node, and a control electrode coupled to the first electrode of the third transistor; a fourth transistor having a first electrode coupled to a second electrode of the third transistor, and a control electrode coupled to the third control terminal; and a fifth transistor having a first electrode coupled to a second electrode of the fourth transistor, a control electrode coupled to the third control terminal, and a second electrode coupled to the pull-up node.

According to an embodiment of the present disclosure, the sensing control circuit further comprises a first protection subcircuit coupled to the sensing input subcircuit, the sensing pull-up subcircuit and the first power supply, and configured to stabilize the level at the holding node based on the first power supply.

According to an embodiment of the present disclosure, the first protection subcircuit comprises: a sixth transistor having a first electrode coupled to the first power supply, a second electrode coupled to the first electrode of the second transistor and the second electrode of the first transistor, and a control electrode coupled to the holding node.

According to an embodiment of the present disclosure, the signal output circuit comprises: a seventh transistor having a first electrode coupled to the first clock terminal, a second electrode coupled to the signal output terminal, and a control electrode coupled to the pull-up node; and a second capacitor having a first end coupled to the control electrode of the seventh transistor, and a second end coupled to the second electrode of the seventh transistor.

According to an embodiment of the present disclosure, the cascade output circuit comprises: an eighth transistor having a first electrode coupled to the second clock terminal, a second electrode coupled to the cascade output terminal, and a control electrode coupled to the pull-up node.

According to an embodiment of the present disclosure, the display control circuit comprises: an input subcircuit coupled to the pull-up node, the first power supply and the first control terminal respectively, and configured to write the level provided at the first power supply into the pull-up node under control of the first control signal at the first control terminal in the display mode; a discharging subcircuit coupled to the pull-up node, a second power supply and a discharging control terminal respectively, and configured to write a level provided at the second power supply into the pull-up node under control of a discharging control signal at the discharging control terminal; a pull-down control subcircuit coupled to the pull-up node, a pull-down node, the first power supply, and the second power supply respectively, and configured to write the level at the second power supply into the pull-down node under control of the level at the pull-up node; a first pull-down subcircuit coupled to the pull-down node, the pull-up node, the cascade output terminal, and the second power supply respectively, and configured to write the level at the second power supply into the pull-up node and the cascade output terminal under control of the level at the pull-down node; a second pull-down subcircuit coupled to the pull-down node, the signal output terminal and the second power supply respectively, and configured to write the level at the second power supply into the signal output terminal under control of the level at the pull-down node; and a reset subcircuit coupled to a reset control terminal, the pull-up node and the second power supply respectively, and configured to be write the level at the second power supply into the pull-up node under control of a reset control signal at the reset control terminal.

According to an embodiment of the present disclosure, the display control circuit further comprises a second protection subcircuit coupled to the pull-up node, the first power supply, the discharging subcircuit, the first pull-down subcircuit, the reset subcircuit and the sensing control circuit, and configured to stabilize the level at the pull-up node based on the first power supply.

According to an embodiment of the present disclosure, the second protection subcircuit comprises: a ninth transistor having a first electrode coupled to the first power supply, a second electrode coupled to a second electrode of a fourth transistor and a first electrode of a fifth transistor, and a control electrode coupled to the pull-up node.

According to an embodiment of the present disclosure, the input subcircuit comprises: a tenth transistor having a first electrode coupled to the first power supply, a second electrode coupled to the pull-up node, and a control electrode coupled to the first control terminal.

According to an embodiment of the present disclosure, the discharging subcircuit comprises: an eleventh transistor having a first electrode coupled to the pull-up node, a second electrode coupled to the second electrode of the ninth transistor, and a control electrode coupled to the discharging control terminal; and a twelfth transistor having a first electrode coupled to the second electrode of the ninth transistor, a second electrode coupled to the second power supply, and a control electrode coupled to the discharging control terminal.

According to an embodiment of the present disclosure, the pull-down control subcircuit comprises: a thirteenth transistor having a first electrode coupled to the first power supply, a second electrode coupled to the pull-down node, and a control electrode coupled to the first electrode of the thirteenth transistor; and a fourteenth transistor having a first electrode coupled to the second electrode of the thirteenth transistor, a second electrode coupled to the second power supply, and a control electrode coupled to the pull-up node.

According to an embodiment of the present disclosure, the first pull-down subcircuit comprises: a fifteenth transistor having a first electrode coupled to the pull-up node, a second electrode coupled to the second electrode of the ninth transistor, and a control electrode coupled to the pull-down node; a sixteenth transistor having a first electrode coupled to the second electrode of the ninth transistor, a second electrode coupled to the second power supply, and a control electrode coupled to the pull-down node; and a seventeenth transistor having a first electrode coupled to the cascade output terminal, a second electrode coupled to the second power supply, and a control electrode coupled to the pull-down node.

According to an embodiment of the present disclosure, the second pull-down subcircuit comprises: an eighteenth transistor having a first electrode coupled to the signal output terminal, a second electrode coupled to the second power supply, and a control electrode coupled to the pull-down node.

According to a second aspect of the embodiments of the present disclosure, there is proposed a gate driving circuit comprising N stages of cascaded shift registers according to claim 1, wherein a first control terminal of an $n^{th}$ stage of shift register is coupled to a cascade output terminal of an $(n-2)^{th}$ stage of shift register, and a discharging control terminal of the $n^{th}$ stage of shift register is coupled to a cascade output terminal of an $(n+3)^{th}$ stage of shift register, wherein N is a natural number, and n is a natural number greater than 2 and less than or equal to N−3.

According to a third aspect of the embodiments of the present disclosure, there is proposed a display panel comprising the gate driving circuit according to the second aspect of the embodiments of the present disclosure.

According to a fourth aspect of the embodiments of the present disclosure, there is proposed a method of driving a shift register, comprising steps of: writing, in a display mode, by a display control circuit, a level provided at a first power supply into a pull-up node under control of a first control signal at a first control terminal, controlling, by a cascade output circuit, a cascade output terminal to output a cascade control signal according to a level at the pull-up node and a second clock signal at a second clock terminal, controlling, by a signal output circuit, a signal output terminal to output a gate driving signal according to the level at the pull-up node and a first clock signal at a first clock terminal, and controlling, by a sensing control circuit, a level at a holding node according to a second control signal at a second control terminal and the cascade control signal at the cascade output terminal; and controlling, in a sensing mode, by the sensing control circuit, the level at the pull-up node according to the level at the holding node and a third control signal at a third control terminal, and controlling, by the signal output circuit, the signal output terminal to output a sensing driving signal according to the level at the pull-up node and the first clock signal at the first clock terminal.

The additional aspects and advantages of the present disclosure will be partly given in the following description, and will partly become obvious from the following description, or be understood through practice of the present disclosure.

BRIEF DESCRIPTION OF THE ACCOMPANYING DRAWINGS

The above and/or additional aspects and advantages of the present disclosure will become clear to understand from the following description of the embodiments in conjunction with the accompanying drawings, in which.

DETAILED DESCRIPTION

The embodiments of the present disclosure will be described in detail below. Examples of the embodiments are shown in the accompanying drawings, throughout which the same or similar reference signs indicate the same or similar elements or elements having the same or similar functions. The embodiments described below with reference to the accompanying drawings are exemplary, and are intended to explain the present disclosure, but should not be construed as limiting the present disclosure.

The shift register and the method of driving the same, the gate driving circuit, and the display panel according to the embodiments of the present disclosure will be described below with reference to the accompanying drawings.

Figure 1:
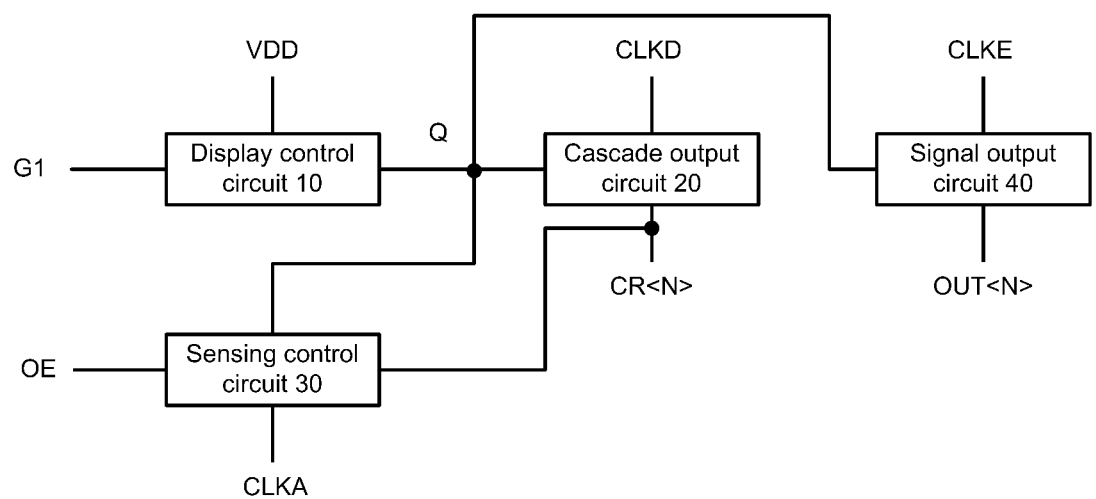
FIG. 1 is a block schematic of a shift register according to an embodiment of the present disclosure.

FIG. 1 is a block schematic of a shift register according to an embodiment of the present disclosure. As shown in FIG. 1, the shift register according to the embodiment of the present disclosure comprises a display control circuit 10, a cascade output circuit 20, a sensing control circuit 30 and a signal output circuit 40.

Here, the display control circuit 10 is coupled to a pull-up node Q, a first power supply VDD and a first control terminal G1 respectively, and is configured to write a level provided at the first power supply VDD into the pull-up node Q under control of a first control signal at the first control terminal G1 in a display mode. The cascade output circuit 20 is coupled to a second clock terminal CLKD, the pull-up node Q and a cascade output terminal CR<N>, and is configured to control the cascade output terminal CR<N> to output a cascade control signal according to a level at the pull-up node Q and a second clock signal at the second clock terminal CLKD in the display mode. The sensing control circuit 30 is coupled to the pull-up node Q, the cascade output terminal CR<N>, a second control terminal OE, and a third control terminal CLKA respectively, and is configured to control a level at a holding node in the sensing control circuit 30 according to a second control signal at the second control terminal OE and the cascade control signal at the cascade output terminal CR<N> in the display mode, and control the level at the pull-up node Q according to the level at the holding node and a third control signal at the third control terminal CLKA in a sensing mode. The signal output circuit 40 is coupled to the pull-up node Q, a first clock terminal CLKE and a signal output terminal OUT<N>, and is configured to control the signal output terminal OUT<N> to output a gate driving signal according to the level at the pull-up node Q and a first clock signal at the first clock terminal CLKE in the display mode, or control the signal output terminal OUT<N> to output a sensing driving signal according to the level at the pull-up node Q and the first clock signal at the first clock terminal CLKE in the sensing mode.

It should be illustrated that the level at the first power supply VDD may be a high direct current level.

Figure 2:
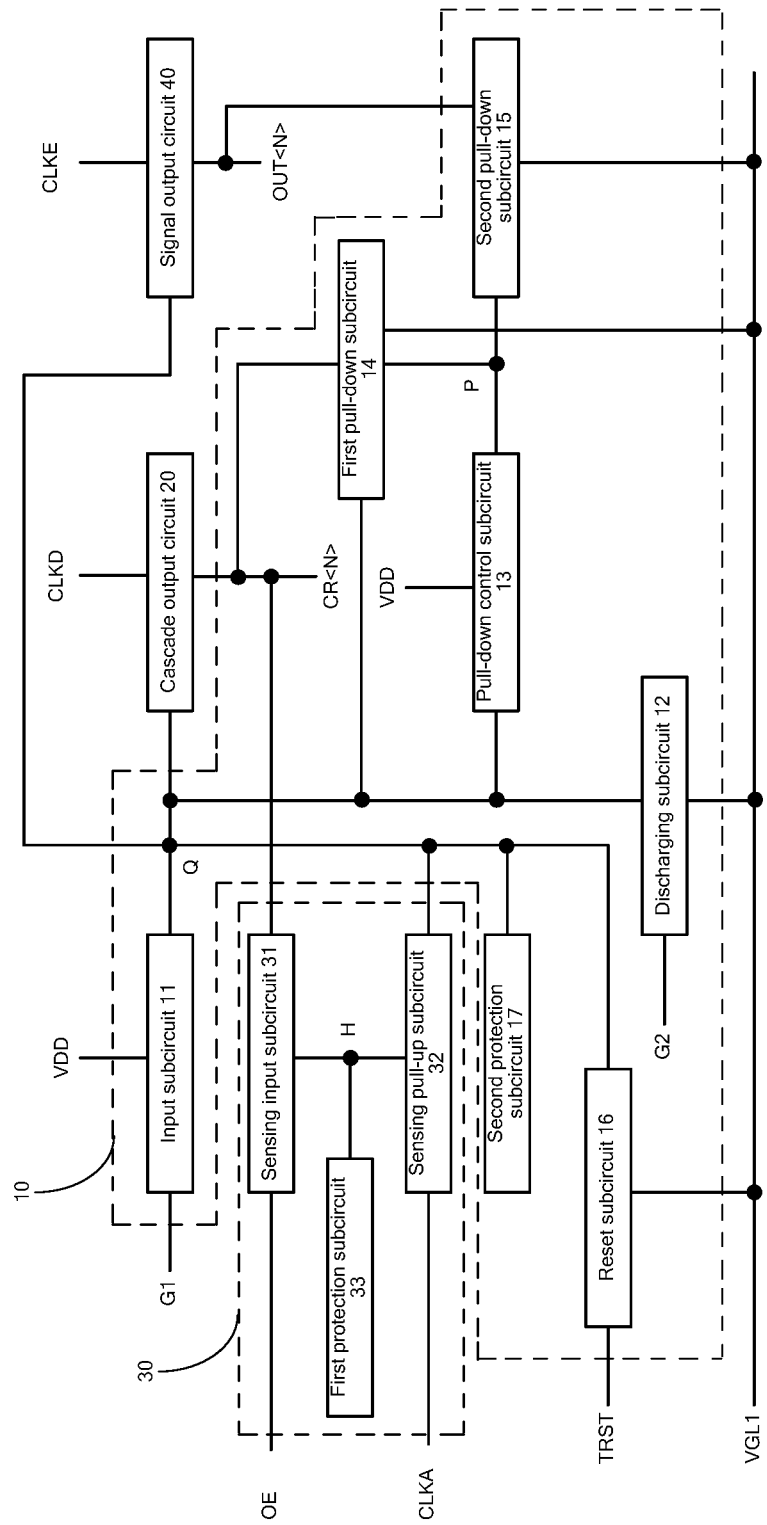
FIG. 2 is a block schematic of a shift register according to another embodiment of the present disclosure.

FIG. 2 is a block schematic of a shift register according to another embodiment of the present disclosure. As shown in FIG. 2, the sensing control circuit 30 comprises a sensing input subcircuit 31 and a sensing pull-up subcircuit 32. The sensing input subcircuit 31 is coupled to the cascade output terminal CR<N>, a holding node H and the second control terminal OE respectively, and is configured to control a level at the holding node H according to the second control signal at the second control terminal OE and the cascade control signal at the cascade output terminal CR<N> in the display mode. The sensing pull-up subcircuit 32 is coupled to the pull-up node Q, the holding node H and the third control terminal CLKA respectively, and is configured to control the level at the pull-up node Q according to the level at the holding node H and the third control signal at the third control terminal CLKA in the sensing mode.

Here, the second control signal at the second control terminal OE may be a random signal generated by an external circuit such as a Field Programmable Gate Array (FPGA).

Further, according to an embodiment of the present disclosure, as shown in FIG. 2, the sensing control circuit 30 further comprises a first protection subcircuit 33 which is coupled to the holding node H to perform leakage current protection on the holding node H, so as to stabilize the level at the holding node H.

Further, according to an embodiment of the present disclosure, as shown in FIG. 2, the display control circuit 10 comprises an input subcircuit 11, a discharging subcircuit 12, a pull-down control subcircuit 13, a first pull-down subcircuit 14, a second pull-down subcircuit 15 and a reset subcircuit 16. The input subcircuit 11 is coupled to the pull-up node Q, the first power supply VDD and the first control terminal G1 respectively, and is configured to write the level provided at the first power supply VDD into the pull-up node Q under control of the first control terminal G1 in the display mode. The discharging subcircuit 12 is coupled to the pull-up node Q, a second power supply VGL1 and a discharging control terminal G2 respectively, and is configured to control the pull-up node Q to discharge towards the second power supply VGL1 and write a level provided at the second power supply VGL1 into the pull-up node Q under control of a discharging control signal at the discharging control terminal G2. The pull-down control subcircuit 13 is coupled to the pull-up node Q, a pull-down node P and the first power supply VDD respectively, and is configured to write the level at the second power supply VGL1 into the pull-down node P under control of the pull-up node Q. The first pull-down subcircuit 14 is coupled to the pull-down node P, the pull-up node Q, the cascade output terminal CR<N> and the second power supply VGL1 respectively, and is configured to pull down the level at the pull-up node Q and the level at the cascade output terminal CR<N> to the level at the second power supply VGL1 under control of the pull-down node P. The second pull-down subcircuit 15 is coupled to the pull-down node P, the signal output terminal OUT<N> and the second power supply VGL1 respectively, and is configured to pull down the level at the signal output terminal OUT<N> to the level at the second power supply VGL1 under control of the pull-down node P. The reset subcircuit 16 is coupled to a reset control terminal TRST, the pull-up node Q and the second power supply VGL1 respectively, and is configured to pull down the level at the pull-up node Q to the level at the second power supply VGL1 under control of a reset control signal at the reset control terminal TRST.

It should be illustrated that the level at the second power supply VGL1 may be a negative direct current level.

Further, according to an embodiment of the present disclosure, as shown in FIG. 2, the display control circuit 10 further comprises a second protection subcircuit 17, which is coupled to the pull-up node Q to perform leakage current protection on the pull-up node Q.

Based on the shift register according to above embodiment, the embodiment of the present disclosure further provides a gate driving circuit comprising multiple stages of shift registers as described above. According to an embodiment of the present disclosure, for an $N^{th}$ stage of shift register, a first control terminal G1 is coupled to a cascade output terminal CR<N−2> of an $(N-2)^{th}$ stage of shift register, and a discharging control terminal G2 is coupled to a cascade output terminal CR<N+3> of an $(N+3)^{th}$ stage of shift register, wherein N is a natural number greater than 2. According to the gate driving circuit proposed in the embodiment of the present disclosure, the multiple stages of shift registers are provided, which may realize output of mixed pulses for display and compensation and compensation for any row of pixels in a display mode of any frame, and has a simple circuit structure.

Figure 3:
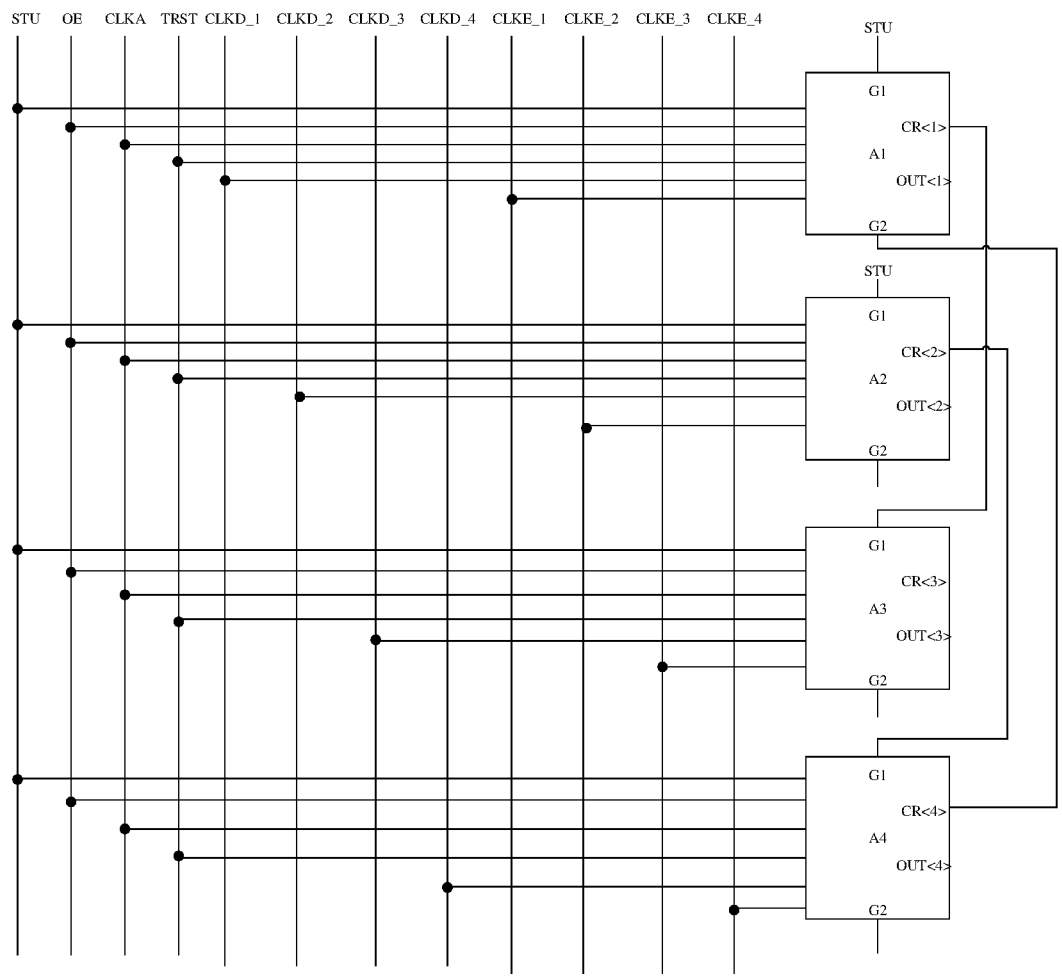
FIG. 3 is a schematic of a cascaded connection of multiple stages of shift registers according to an embodiment of the present disclosure.

FIG. 3 is a schematic of a cascaded connection of multiple stages of shift registers according to an embodiment of the present disclosure. As shown in FIG. 3, a preset input signal is input in first control terminals G1 of a first stage of shift register A1 and a second stage of shift register A2, which is an STU signal in FIG. 3, and a discharging control terminal G2 of the first stage of shift register A1 is coupled to a cascade output terminal CR<4> of a fourth stage of shift register A4. Similarly, a discharging control terminal G2 of the second stage of shift register A2 is coupled to a cascade output terminal CR<5> of a fifth stage of shift register A5, a discharging control terminal G2 of a third stage of shift register A3 is coupled to a cascade output terminal CR<6> of a sixth stage of shift register A6, and a discharging control terminal G2 of the fourth stage of shift register A4 is coupled to a cascade output terminal CR<7> of a seventh stage of shift register A7. A first control terminal G1 of the third stage of shift register A3 is coupled to a cascade output terminal CR<1> of the first stage of shift register A1, and a first control terminal G1 of the fourth stage of shift register A4 is coupled to a cascade output terminal CR<2> of the second stage of shift register A2.

Figure 4:
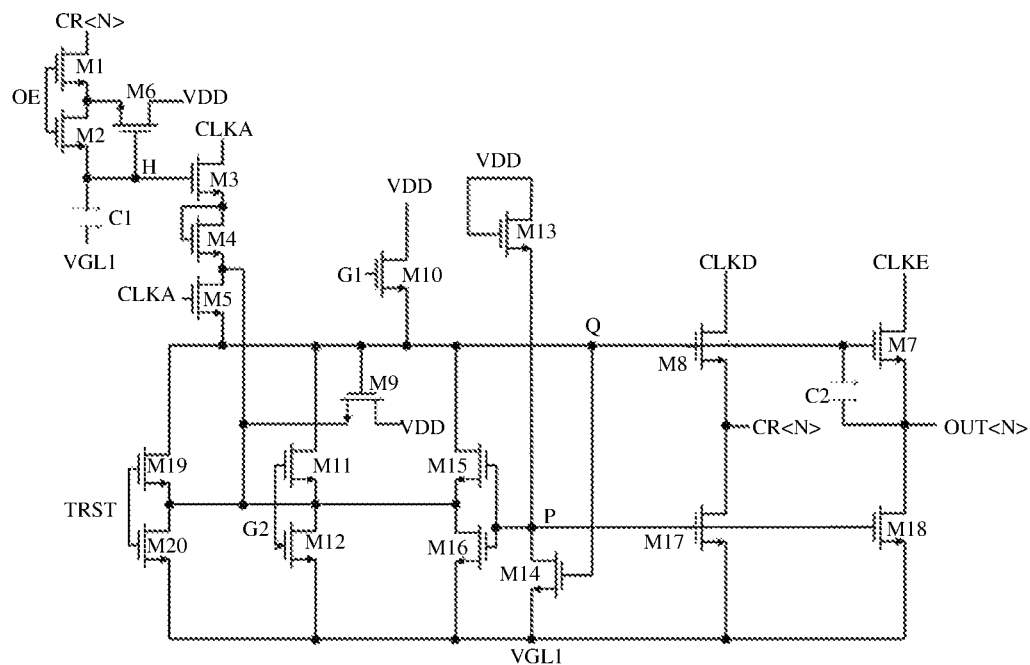
FIG. 4 is a circuit diagram of a shift register according to an embodiment of the present disclosure.
Figure 5:
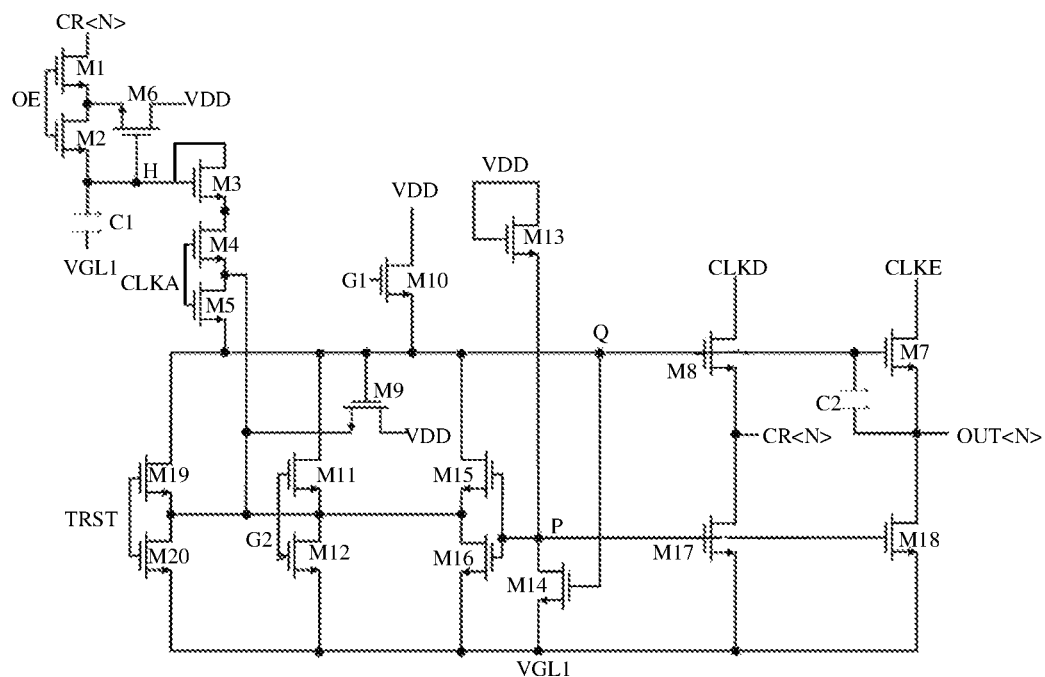
FIG. 5 is a circuit diagram of a shift register according to another embodiment of the present disclosure.

FIGS. 4 and 5 are circuit diagrams of a shift register according to an embodiment of the present disclosure. A structure of the shift register according to the embodiment of the present disclosure will be described below with reference to FIGS. 4 and 5, and the shift register is an $N^{th}$ stage of shift register.

As shown in FIGS. 4 and 5, the sensing input subcircuit 31 comprises a first transistor M1, a second transistor M2, and a first capacitor C1. The first transistor M1 has a first electrode coupled to a cascade output terminal CR<N> of the $N^{th}$ stage of shift register, and a control electrode coupled to the second control terminal OE. The second transistor M2 has a first electrode coupled to a second electrode of the first transistor M1, a second electrode coupled to the holding node H, and a control electrode coupled to the second control terminal OE. The first capacitor C1 has a first end coupled to the holding node H, and a second end coupled to the second power supply VGL1.

As shown in FIG. 4, the sensing pull-up subcircuit 32 is configured to write a level at the third control terminal CLKA into the pull-up node Q under control of the holding node H and the third control terminal CLKA in the sensing mode. The sensing pull-up subcircuit 32 comprises a third transistor M3, a fourth transistor M4, and a fifth transistor M5. The third transistor M3 has a first electrode coupled to the third control terminal CLKA, and a control electrode coupled to the holding node H. The fourth transistor M4 has a first electrode coupled to a second electrode of the third transistor M3, and a control electrode coupled to the first electrode of the fourth transistor M4. The fifth transistor M5 has a first electrode coupled to a second electrode of the fourth transistor M4, a control electrode coupled to the third control terminal CLKA, and a second electrode coupled to the pull-up node Q.

As shown in FIG. 5, the sensing pull-up subcircuit 32 is configured to write the level at the holding node H into the pull-up node Q under control of the third control terminal CLKA in the sensing mode. The sensing pull-up subcircuit 32 comprises a third transistor M3, a fourth transistor M4, and a fifth transistor M5. The third transistor M3 has a first electrode coupled to the holding node H, and a control electrode coupled to the first electrode of the third transistor M3. The fourth transistor M4 has a first electrode coupled to a second electrode of the third transistor M3, and a control electrode coupled to the third control terminal CLKA. The fifth transistor M5 has a first electrode coupled to a second electrode of the fourth transistor M4, a control electrode coupled to the third control terminal CLKA, and a second electrode coupled to the pull-up node Q.

As shown in FIGS. 4 and 5, the first protection subcircuit 33 comprises a sixth transistor M6 having a first electrode coupled to the first power supply VDD, a second electrode coupled to the first electrode of the second transistor M2 and the second electrode of the first transistor M1, and a control electrode coupled to the holding node H. When the holding node H is at a high level, the sixth transistor M6 is turned on, so that the level provided at the first power supply VDD, that is, a high level, is written into the second electrode of the first transistor M1, so as to perform leakage current protection on the pull-up node Q.

As shown in FIGS. 4 and 5, the signal output circuit 40 comprises a seventh transistor M7 and a second capacitor C2. The seventh transistor M7 has a first electrode coupled to the first clock terminal CLKE, a second electrode coupled to the signal output terminal OUT<N>, and a control electrode coupled to the pull-up node Q. The second capacitor C2 has a first end coupled to the control electrode of the seventh transistor M7, and a second end coupled to the second electrode of the seventh transistor M7.

As shown in FIGS. 4 and 5, the cascade output circuit 20 comprises an eighth transistor M8 having a first electrode coupled to the second clock terminal CLKD, a second electrode coupled to the cascade output terminal CR<N>, and a control electrode coupled to the pull-up node Q.

As shown in FIGS. 4 and 5, the second protection subcircuit 17 comprises a ninth transistor M9 having a first electrode coupled to the first power supply VDD, a second electrode coupled to the sensing pull-up subcircuit 32, the discharging subcircuit 12, the first pull-down subcircuit 14 and the reset subcircuit 16 of the sensing control circuit 30, and a control electrode coupled to the pull-up node Q. When the pull-up node Q is at a high level, the ninth transistor M9 is turned on, so that the level provided at the first power supply VDD, that is, a high level, is written into the first electrode of the fifth transistor M5, a second electrode of a nineteenth transistor M19, a second electrode of an eleventh transistor M11 and a second electrode of a fifteenth transistor M15, so as to perform leakage current protection on the pull-up node Q. Specifically, as shown in FIGS. 4 and 5, the second electrode of the ninth transistor M9 is coupled to the second electrode of the fourth transistor M4 and the first electrode of the fifth transistor M5, the second electrode of the eleventh transistor M11 and a first electrode of the twelve transistor M12, the second electrode of the fifteenth transistor M15 and a first electrode of the sixteenth transistor M16, and the second electrode of the nineteenth transistor M19 and a first electrode of the twentieth transistor M20.

As shown in FIGS. 4 and 5, the input subcircuit 11 comprises a tenth transistor M10 having a first electrode coupled to the first power supply VDD, a second electrode coupled to the pull-up node Q, and a control electrode coupled to the first control terminal G1.

As shown in FIGS. 4 and 5, the discharging subcircuit 12 comprises an eleventh transistor M11 and a twelfth transistor M12. The eleventh transistor M11 has a first electrode coupled to the pull-up node Q, a second electrode coupled to the discharging control terminal G2, and a second electrode coupled to a first electrode of the twelfth transistor M12. The twelfth transistor M12 has a second electrode coupled to the second power supply VGL1, and a control electrode coupled to the discharging control terminal G2.

As shown in FIGS. 4 and 5, the pull-down control subcircuit 13 comprises a thirteenth transistor M13 and a fourteenth transistor M14. The thirteenth transistor M13 has both a control electrode and a first electrode coupled to the first power supply VDD, and a second electrode coupled to the pull-down node P. The fourteenth transistor M14 has a first electrode coupled to the pull-down node P, a control electrode coupled to the pull-up node Q, and a second electrode coupled to the second power supply VGL1.

As shown in FIGS. 4 and 5, the first pull-down subcircuit 14 comprises a fifteenth transistor M15, a sixteenth transistor M16, and a seventeenth transistor M17. The fifteenth transistor M15 has a first electrode coupled to the pull-up node Q, a second electrode coupled to the first electrode of the fifteenth transistor M15, and a control electrode coupled to the pull-down node P. The sixteenth transistor M16 has a second electrode coupled to the second power supply VGL1, and a control electrode coupled to the pull-down node P. The seventeenth transistor M17 has a first electrode coupled to the cascade output terminal CR<N>, a second electrode coupled to the second power supply VGL1, and a control electrode coupled to the pull-down node P.

As shown in FIGS. 4 and 5, the second pull-down subcircuit 15 comprises an eighteenth transistor M18. The eighteenth transistor M18 has a first electrode coupled to the signal output terminal OUT<N>, a second electrode coupled to the second power supply VGL1, and a control electrode coupled to the pull-down node P.

As shown in FIGS. 4 and 5, the reset subcircuit 16 comprises a nineteenth transistor M19 and a twentieth transistor M20. The nineteenth transistor M19 has a first electrode coupled to the pull-up node Q, a second electrode coupled to a first electrode of the twentieth transistor M20, and a control electrode coupled to the reset control terminal TRST. The twentieth transistor M20 has a second electrode coupled to the second power supply VGL1, and a control electrode coupled to the reset control terminal TRST.

It should be illustrated that, in the embodiment of the present disclosure, description is made by taking an NPN-type MOSFET or IGBT transistor as an example, but the embodiment of the present disclosure is not limited thereto, and other types of transistors may be used.

It should also be illustrated that the first capacitor C1 and the second capacitor C2 may be parasitic capacitors of transistors, or may also be external capacitors.

Figure 6:
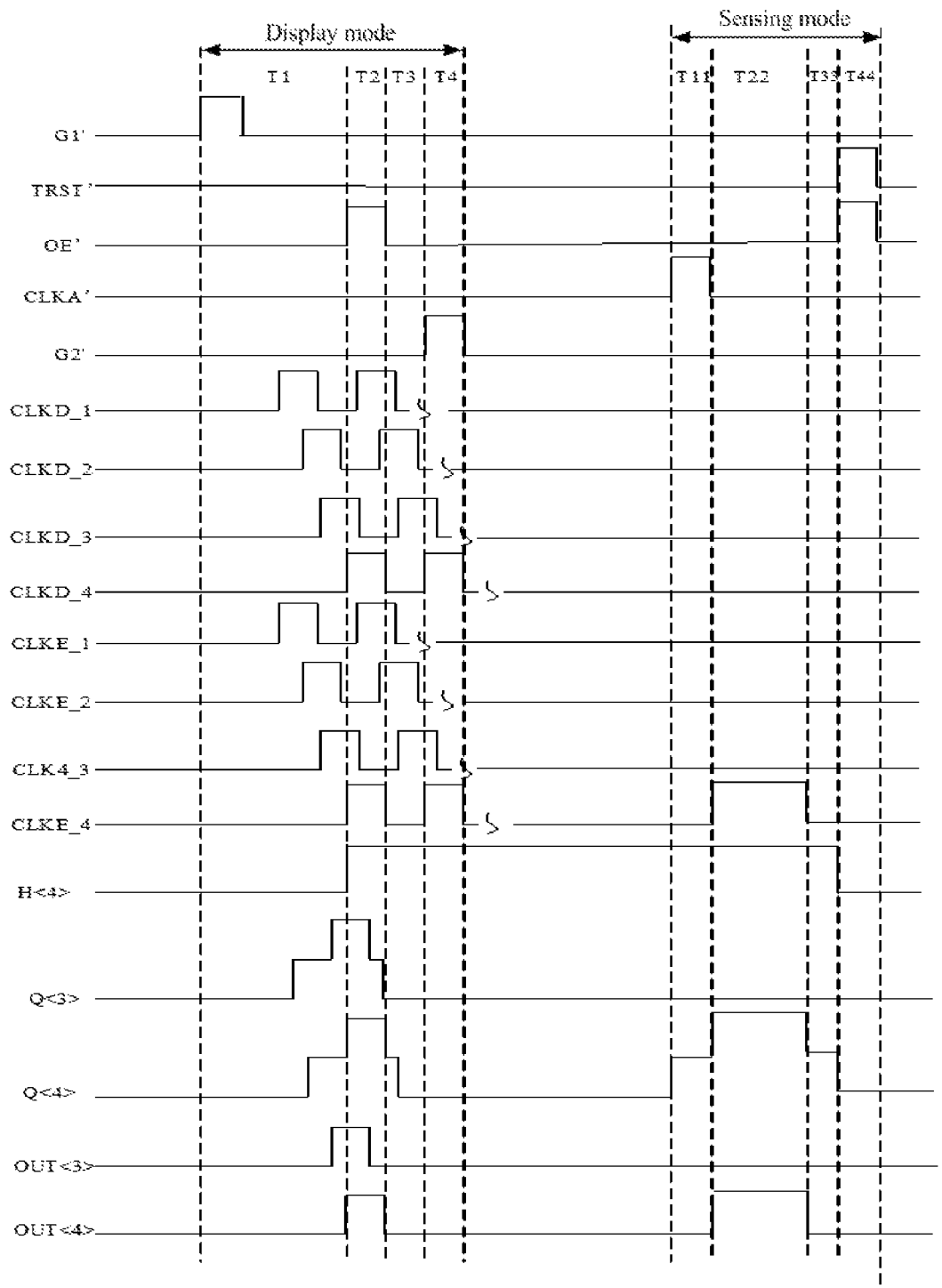
FIG. 6 is a control timing diagram of a shift register according to an embodiment of the present disclosure.

FIG. 6 is a control timing diagram of a shift register according to an embodiment of the present disclosure. An operating principle of the gate driving circuit according to the embodiments of FIG. 4 and FIG. 5 will be described below in conjunction with the timing diagram of FIG. 6.

As shown in FIG. 6, G1' is an output signal at the first control terminal G1, OE' is a second control signal output at the second control terminal OE, CLKA' is a third control signal output at the third control terminal CLKA, CLKD_1 is a second clock signal output from the second clock terminal CLKD to a first row, CLKD_2 is a second clock signal output from the second clock terminal CLKD to a second row, CLKD_3 is a second clock signal output from the second clock terminal CLKD to a third row, CLKD_4 is a second clock signal output from the second clock terminal CLKD to a fourth row, and CLKD_1 to CLKD_4 are repeated from a fifth row. CLKE_1 is a first clock signal output from the first clock terminal CLKE to the first row, CLKE_2 is a first clock signal output from the first clock terminal CLKE to the second row, CLKE_3 is a first clock signal output from the first clock terminal CLKE to the third row, CLKE_4 is a first clock signal output from the first clock terminal CLKE to the fourth row, and CLKE_1 to CLKE_4 are repeated from the fifth row. TRST' is an output signal at the reset control terminal TRST, G2' is an output signal at the discharging control terminal G2, H<4> is a level signal at a holding node H of the fourth row, Q<3> is a level signal at a pull-up node Q of the third row, Q<4> is a level signal at a pull-up node of the fourth row, OUT<3> is an output signal at a signal output terminal OUT<N> of the third row, OUT<4> is an output signal at a signal output terminal OUT<N> of the fourth row. Here, a pulse width relationship among the third control signal output at the third control terminal CLKA, the second clock signal output at the second clock terminal CLKD, the first clock signal output at the first clock terminal CLKE, and the output signal at the reset control terminal TRST is adjustable.

An operating process of a fourth stage of shift register of the gate driving circuit will be described below in conjunction with FIG. 6.

In a first phase T1 of a display mode, a cascade output terminal CR<2> of the second row is at a high level, so that a first control terminal G1 of the fourth row outputs a high level signal, and the tenth transistor M10 is turned on. The high level provided at the first power supply VDD is written into the pull-up node Q of the fourth row through the tenth transistor M10, and charges the second capacitor C2. The eighth transistor M8 and the seventh transistor M7 are turned on in advance, and a preset input signal STD is at a low level, so that a discharging control terminal G2 of the fourth row outputs a low level signal, and the eleventh transistor M11 and the twelfth transistor M12 are turned off. The third control signal output at the third control terminal CLKA is a low level signal, and when a circuit structure of the shift register is as shown in FIG. 3, the fifth transistor M5 is turned off, and when the circuit structure of the shift register is as shown in FIG. 4, the fourth transistor M4 and the fifth transistor M5 are turned off. The first clock signal output from the first clock terminal CLKE to the fourth row is a low level signal, so that a cascade output terminal CR<4> of the fourth row outputs a low level, and the second clock signal output from the second clock terminal CLKD to the fourth row is a low level signal, so that a signal output terminal OUT<4> of the fourth row outputs a low level.

In a second phase T2 of the display mode, the first clock signal output from the first clock terminal CLKE to the fourth row is a high level signal, and the second clock signal output from the second clock terminal CLKD to the fourth row is a high level signal. At this time, a level at the pull-up node Q of the fourth row raises under bootstrap of the second capacitor C2, and the eighth transistor M8 and the seventh transistor M7 are completely turned on. Thereby, the cascade output terminal CR<4> of the fourth row outputs a high level, and the signal output terminal OUT<4> of the fourth row outputs a high level, that is, a gate driving signal. At this time, the third control signal output at the third control terminal CLKA is still a low level signal, and the cascade output terminal CR<2> of the second row becomes a low level, so that an output at the first control terminal G1 of the fourth row changes to be a low level signal. The preset input signal STD is at a low level, so that the discharging control terminal G2 of the fourth row outputs a low level signal, and the eleventh transistor M11 and the twelfth transistor M12 are turned off. An output signal at the reset control terminal TRST is a low level signal, and the nineteenth transistor M19 and the twentieth transistor M20 are turned off. The second control signal output at the second control terminal OE is a high level signal, and the first transistor M1 and the second transistor M2 are turned on, so that a high level output at the cascade output terminal CR<4> of the fourth row is written into the holding node H of the fourth row.

In a third phase T3 of the display mode, the first clock signal output from the first clock terminal CLKE to the fourth row changes to be a low level signal, and the second clock signal output from the second clock terminal CLKD to the fourth row changes to be a low level signal, so that the cascade output terminal CR<4> of the fourth row outputs a low level, and the signal output terminal OUT<4> of the fourth row outputs a low level, so as to complete resetting of the cascade output terminal CR<4> and the signal output terminal OUT<4> of the fourth row.

In a fourth phase T4 of the display mode, the preset input signal STD is at a high level, so that the discharging control terminal G2 of the fourth row outputs a high level signal. The eleventh transistor M11 and the twelfth transistor M12 are turned on, the pull-up node Q of the fourth row discharges towards the second power supply VGL1, and the level at the pull-up node Q of the fourth row is pulled down, so as to complete resetting of the pull-up node Q of the fourth row.

It should be illustrated that, in the display mode, the holding node H of the fourth row always remains at a high level until a blanking area (a blanking period) appears. Here, it should be illustrated that the sensing mode is executed in the blanking area.

In a first phase T11 of the sensing mode, the third control signal output at the third control terminal CLKA is a high level signal, and when the circuit structure of the shift register is as shown in FIG. 4, the fifth transistor M5 is turned on. In addition, it should be illustrated that in the display mode of this frame, a high level signal is written into the holding node H of the fourth row, and therefore, at this time, the holding node H of the fourth row is at a high level, so that the third transistor M3 is turned on, and the level at the third control terminal CLKA, that is, a high level, is written into the control electrode and the first electrode of the fourth transistor M4. The fourth transistor M4 is turned on, and thereby the level at the third control terminal CLKA, that is, a high level, is written into the pull-up node Q through the third transistor M3, the fourth transistor M4 and the fifth transistor M5.

In a case where the circuit structure of the shift register is as shown in FIG. 5, when the third control signal output at the third control terminal CLKA is a high level signal, the fourth transistor M4 and the fifth transistor M5 are turned on, and at this time, the holding node H of the fourth row is at a high level. The third transistor M3 is turned on, and the level at the holding node H of the fourth row, that is, a high level, is written into the first electrode of the fourth transistor M4, so that the level at the holding node H of the fourth row, that is, a high level, is written into the pull-up node Q of the fourth row through the third transistor M3, the fourth transistor M4, and the fifth transistor M5, and is maintained by the second capacitor C2.

In a second phase T22 of the sensing mode, the third control signal output at the third control terminal CLKA changes to be a low level signal, the first clock signal output from the first clock terminal CLKE to the fourth row is a high level signal, and at this time, the seventh transistor M7 is turned on under control of the pull-up node Q of the fourth row, so that the signal output terminal OUT<4> of the fourth row outputs a high level, that is, a sensing driving signal.

In a third phase T33 of the sensing mode, the first clock signal output at the first clock terminal CLKE changes to be a low level signal, and at this time, the seventh transistor M7 is turned on under control of the pull-up node Q of the fourth row, so that the signal output terminal OUT<4> of the fourth row outputs a low level.

In a fourth phase T44 of the sensing mode, the second control signal output at the second control terminal OE is a high level signal, and the first transistor M1 and the second transistor M2 are turned on, so that a low level output at the cascade output terminal CR<4> of the fourth row is written into the holding node H to reset the holding node H. The output signal at the reset control terminal TRST is a high level signal, the nineteenth transistor M19 and the twentieth transistor M20 are turned on, and the pull-up node Q is pulled down to the level at the second power supply VGL1, that is, a low level, to reset the pull-up node Q.

In this way, an output of mixed pulses for display and compensation may be realized, and random sensing may be realized, that is, any row of pixels is compensated in a display mode of any frame.

Specifically, in the fourth phase of the sensing mode, the second control signal output at the second control terminal OE and the output signal at the reset control terminal TRST are both high level signals, so that the first transistor M1, the second transistor M2, the nineteenth transistor M19 and the twentieth transistor M20 are turned on to reset holding nodes H and pull-up nodes Q of all rows. Then, in the display mode, any row of pixels may be compensated.

According to the shift register proposed by the embodiment of the present disclosure, the display control circuit is coupled to the pull-up node, the first power supply and the first control terminal respectively, and is configured to write the level provided at the first power supply into the pull-up node under control of the first control terminal in the display mode; the cascade output circuit is coupled to the second clock terminal, the pull-up node and the cascade output terminal, and is configured to control the cascade output terminal to output the cascade control signal according to the level at the pull-up node and the second clock signal at the second clock terminal in the display mode; the sensing control circuit is coupled to the pull-up node, the cascade output terminal, the second control terminal, and the third control terminal respectively, and is configured to control the level at the holding node according to the second control signal at the second control terminal and the cascade control signal at the cascade output terminal in the display mode, and control the level at the pull-up node according to the level at the holding node and the third control signal at the third control terminal in the sensing mode; and the signal output circuit is coupled to the pull-up node, the first clock terminal and the signal output terminal, and is configured to control the signal output terminal to output the gate driving signal or the sensing driving signal according to the level at the pull-up node and the first clock signal at the first clock terminal in the display mode or the sensing mode. Thereby, the shift register according to the embodiment of the present disclosure may realize an output of mixed pulses for display and compensation, and may realize compensation for any row of pixels in a display mode of any frame, and has a simple circuit structure.

Further, the embodiments of the present disclosure further provide a display panel, which may comprise a gate driving circuit composed of multiple stages of cascaded shift registers.

According to the display panel proposed by the embodiment of the present disclosure, the gate driving circuit is provided, which may realize an output of mixed pulses for display and compensation, and may realize compensation for any row of pixels in a display mode of any frame, and has a simple circuit structure.

Figure 7:
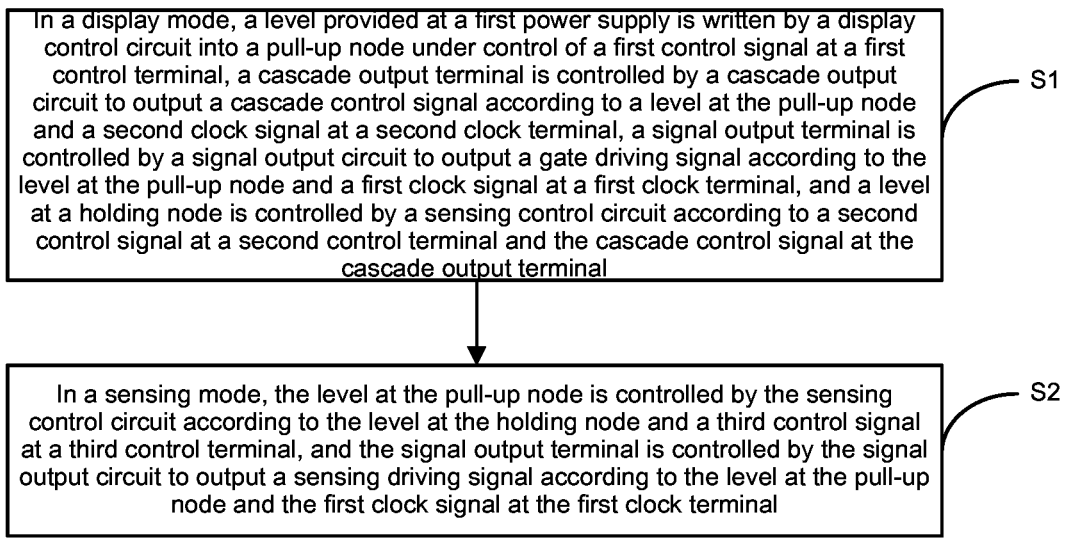
FIG. 7 is a schematic flowchart of a method of driving a shift register according to an embodiment of the present disclosure.

The embodiments of the present disclosure further provide a method of driving a shift register. FIG. 7 is a schematic flowchart of a method of driving a shift register according to an embodiment of the present disclosure. As shown in FIG. 7, the method of driving a shift register according to the embodiment of the present disclosure comprises the following steps.

In step S1, in a display mode, a level provided at a first power supply is written by a display control circuit into a pull-up node under control of a first control signal at a first control terminal, a cascade output terminal is controlled by a cascade output circuit to output a cascade control signal according to a level at the pull-up node and a second clock signal at a second clock terminal, a signal output terminal is controlled by a signal output circuit to output a gate driving signal according to the level at the pull-up node and a first clock signal at a first clock terminal, and a level at a holding node is controlled by a sensing control circuit according to a second control signal at a second control terminal and the cascade control signal at the cascade output terminal.

In step S2, in a sensing mode, the level at the pull-up node is controlled by the sensing control circuit according to the level at the holding node and a third control signal at a third control terminal, and the signal output terminal is controlled by the signal output circuit to output a sensing driving signal according to the level at the pull-up node and the first clock signal at the first clock terminal.

It should be illustrated that above explanations for the embodiments of the shift register is also applicable to the method of driving the shift register according to the embodiment of the present disclosure, and will not be repeated here.

In summary, according to the method of driving the shift register according to the embodiment of the present disclosure, in the display mode, the display control circuit writes a level provided at the first power supply into the pull-up node under control of the first control terminal, the cascade output circuit controls the cascade output terminal to output a cascade control signal according to the level at the pull-up node and the second clock signal at the second clock terminal, the signal output circuit controls the signal output terminal to output a gate driving signal according to the level at the pull-up node and the first clock signal at the first clock terminal, and the sensing control circuit controls the level at the holding node according to the second control signal at the second control terminal and the cascade control signal at the cascade output terminal; and in the sensing mode, the sensing control circuit controls the level at the pull-up node according to the level at the holding node and the third control signal at the third control terminal, and the signal output circuit controls the signal output terminal to output a sensing driving signal according to the level at the pull-up node and the first clock signal at the first clock terminal. Thereby, the method of driving the shift register according to the embodiment of the present disclosure may realize an output of mixed pulses for display and compensation, and may realize compensation for any row of pixels in a display mode of any frame.

In the description of the present specification, the description referring to the terms "one embodiment", "some embodiments", "an example", "a specific example", or "some examples" etc. means that a specific feature, structure, material or characteristics described in conjunction with the embodiment or example is included in at least one embodiment or example of the present disclosure. In the present specification, schematic expressions of the above terms do not necessarily have to refer to the same embodiment or example. Furthermore, the specific feature, structure, material, or characteristics described may be combined in any suitable manner in any one or more embodiments or examples. In addition, those skilled in the art can combine and merge different embodiments or examples described in the present specification and features in different embodiments or examples without conflicting with each other.

Furthermore, the terms "first" and "second" are used for descriptive purposes only, and are not to be construed as indicating or implying relative importance or implicitly indicating a number of indicated technical features. Thus, features defined by "first" and "second" may explicitly or implicitly include at least one of the features. In the description of the present disclosure, "plurality" means at least two, such as two, three, etc., unless explicitly and specifically defined otherwise.

Any process or method described in the flowcharts or described elsewhere herein may be construed as meaning modules, sections, or portions including codes of executable instructions of one or more steps for implementing a custom logic function or process. Further, the scope of the preferred implementations of the present disclosure includes additional implementations in which functions may be performed in a substantially simultaneous manner or in a reverse order, depending on the functions involved, instead of the order shown or discussed, which should be understood by those skilled in the art to which the embodiments of the present disclosure pertain.

A logic and/or steps represented in the flowcharts or otherwise described herein, for example, may be considered as a sequence listing of executable instructions for implementing logical functions, and may be embodied in any computer-readable medium for use by an instruction execution system, apparatus or device (for example, a computer-based system, a system including a processor or other systems which may obtain instructions from the instruction execution system, apparatus or device and may execute the instructions), or may be used in combination with the instruction execution system, apparatus or device. As for this specification, a "computer-readable medium" may be any means which may contain, store, communicate, propagate, or transmit programs for use by or in connection with the instruction execution system, apparatus, or device. More specific examples (non-exhaustive listings) of the computer-readable media include an electrical connection part (an electronic apparatus) having one or more wirings, a portable computer disk cartridge (a magnetic apparatus), a Random Access Memory (RAM), a Read Only Memory (ROM), an Erasable and Programmable Read Only Memory (an EPROM) or a flash memory, a fiber optic apparatus, and a portable Compact Disc-Read Only Memory (CD-ROM). In addition, the computer-readable media may even be paper or other suitable medium on which the programs may be printed, as the programs may be obtained electronically by optically scanning the paper or the other medium and then editing, interpreting, or performing other suitable processing (if necessary) on the paper or the other medium, and then the programs are stored in a computer memory.

It should be understood that portions of the present disclosure may be implemented in hardware, software, firmware, or a combination thereof. In the above embodiments, a plurality of steps or methods may be implemented using software or firmware stored in a memory and executed by a suitable instruction execution system. For example, if implemented in hardware, as in another embodiment, it can be implemented using any one or a combination of the following techniques known in the art: discrete logic gates having logic gate circuits for implementing logic functions on data signals, an application-specific integrated circuit having a suitable combinational logic gate circuit, a Programmable Gate Array (PGA), a Field Programmable Gate Array (FPGA), etc.

It can be understood by those of ordinary skill in the art that all or a part of steps carried in the method according to the embodiments may be completed by programs instructing a related hardware. The programs may be stored in a computer-readable storage medium. When executed, the programs include one or a combination of the steps of the method embodiments.

In addition, various functional units in various embodiments of the present disclosure may be integrated in one processing module, or may exist alone physically, or two or more units may be integrated in one module. The integrated module may be implemented in a form of hardware or in a form of a software functional module. The integrated module may also be stored in a computer readable storage medium if it is implemented in a form of a software functional module and sold or used as an independent product.

The above-mentioned storage medium may be a read only memory, a magnetic disk or an optical disk etc.

Although the embodiments of the present disclosure have been illustrated and described above, it can be understood that the above embodiments are exemplary and are not to be construed as limiting the scope of the disclosure. Changes, modifications, substitutions and variations can be made to the above embodiments by those of ordinary skill in the art within the scope of the present disclosure.

We claim:

1. A shift register, comprising:
   a display control circuit coupled to a pull-up node of the shift register, a first power supply of the shift register and a first control terminal of the shift register respectively, and configured to write a level provided at the first power supply into the pull-up node under control of a first control signal at the first control terminal in a display mode;
   a signal output circuit coupled to the pull-up node, a first clock terminal of the shift register and a signal output terminal of the shift register, and configured to control the signal output terminal to output a gate driving signal or a sensing driving signal according to a level at the pull-up node and a first clock signal at the first clock terminal;
   a cascade output circuit coupled to a second clock terminal of the shift register, the pull-up node and a cascade output terminal of the shift register, and configured to control the cascade output terminal to output a cascade control signal according to the level at the pull-up node and a second clock signal at the second clock terminal; and
   a sensing control circuit coupled to the pull-up node, the cascade output terminal, a second control terminal of the shift register, and a third control terminal of the shift register, respectively, and configured to control a level at a holding node according to a second control signal at the second control terminal and the cascade control signal at the cascade output terminal in the display mode, and control the level at the pull-up node according to the level at the holding node and a third control signal at the third control terminal in a sensing mode.

2. The shift register according to claim 1, wherein the sensing control circuit comprises:
   a sensing input subcircuit coupled to the cascade output terminal, the holding node and the second control terminal respectively, and configured to control the level at the holding node according to the second control signal at the second control terminal and the cascade control signal at the cascade output terminal in the display mode; and
   a sensing pull-up subcircuit coupled to the pull-up node, the holding node and the third control terminal respectively, and configured to control the level at the pull-up node according to the level at the holding node and the third control signal at the third control terminal in the sensing mode.

3. The shift register according to claim 2, wherein the sensing input subcircuit comprises:
   a first transistor having a first electrode coupled to the cascade output terminal, and a control electrode coupled to the second control terminal;
   a second transistor having a first electrode coupled to a second electrode of the first transistor, a second electrode coupled to the holding node, and a control electrode coupled to the second control terminal; and
   a first capacitor having a first end coupled to the holding node, and a second end coupled to a second power supply.

4. The shift register according to claim 3, wherein the sensing control circuit further comprises a first protection subcircuit coupled to the sensing input subcircuit, the sensing pull-up subcircuit and the first power supply, and configured to stabilize the level at the holding node based on the first power supply.

5. The shift register according to claim 4, wherein the first protection subcircuit comprises:
   a sixth transistor having a first electrode coupled to the first power supply, a second electrode coupled to the first electrode of the second transistor and the second electrode of the first transistor, and a control electrode coupled to the holding node.

6. The shift register according to claim 2, wherein the sensing pull-up subcircuit comprises:

a third transistor having a first electrode coupled to the third control terminal, and a control electrode coupled to the holding node;

a fourth transistor having a first electrode coupled to a second electrode of the third transistor, and a control electrode coupled to the first electrode of the fourth transistor; and a fifth transistor having a first electrode coupled to a second electrode of the fourth transistor, a control electrode coupled to the third control terminal, and a second electrode coupled to the pull-up node.

7. The shift register according to claim 2, wherein the sensing pull-up subcircuit comprises:

a third transistor having a first electrode coupled to the holding node, and a control electrode coupled to the first electrode of the third transistor;

a fourth transistor having a first electrode coupled to a second electrode of the third transistor, and a control electrode coupled to the third control terminal; and a fifth transistor having a first electrode coupled to a second electrode of the fourth transistor, a control electrode coupled to the third control terminal, and a second electrode coupled to the pull-up node.

8. The shift register according to claim 1, wherein the signal output circuit comprises:

a seventh transistor having a first electrode coupled to the first clock terminal, a second electrode coupled to the signal output terminal, and a control electrode coupled to the pull-up node; and a second capacitor having a first end coupled to the control electrode of the seventh transistor, and a second end coupled to the second electrode of the seventh transistor.

9. The shift register according to claim 1, wherein the cascade output circuit comprises:

an eighth transistor having a first electrode coupled to the second clock terminal, a second electrode coupled to the cascade output terminal, and a control electrode coupled to the pull-up node.

10. The shift register according to claim 1, wherein the display control circuit comprises:

an input subcircuit coupled to the pull-up node, the first power supply and the first control terminal respectively, and configured to write the level provided at the first power supply into the pull-up node under control of the first control signal at the first control terminal in the display mode;

a discharging subcircuit coupled to the pull-up node, a second power supply and a discharging control terminal respectively, and configured to write a level provided at the second power supply into the pull-up node under control of a discharging control signal at the discharging control terminal;

a pull-down control subcircuit coupled to the pull-up node, a pull-down node, the first power supply, and the second power supply respectively, and configured to write the level at the second power supply into the pull-down node under control of the level at the pull-up node;

a first pull-down subcircuit coupled to the pull-down node, the pull-up node, the cascade output terminal, and the second power supply respectively, and configured to write the level at the second power supply into the pull-up node and the cascade output terminal under control of the level at the pull-down node;

a second pull-down subcircuit coupled to the pull-down node, the signal output terminal and the second power supply respectively, and configured to write the level at the second power supply into the signal output terminal under control of the level at the pull-down node; and a reset subcircuit coupled to a reset control terminal, the pull-up node and the second power supply respectively, and configured to be write the level at the second power supply into the pull-up node under control of a reset control signal at the reset control terminal.

11. The shift register according to claim 10, wherein the display control circuit further comprises a second protection subcircuit coupled to the pull-up node, the first power supply, the discharging subcircuit, the first pull-down subcircuit, the reset subcircuit and the sensing control circuit, and configured to stabilize the level at the pull-up node based on the first power supply.

12. The shift register according to claim 11, wherein the second protection subcircuit comprises:

a ninth transistor having a first electrode coupled to the first power supply, a second electrode coupled to a second electrode of a fourth transistor and a first electrode of a fifth transistor, and a control electrode coupled to the pull-up node.

13. The shift register according to claim 12, wherein the input subcircuit comprises:

a tenth transistor having a first electrode coupled to the first power supply, a second electrode coupled to the pull-up node, and a control electrode coupled to the first control terminal.

14. The shift register according to claim 12, wherein the discharging subcircuit comprises:

an eleventh transistor having a first electrode coupled to the pull-up node, a second electrode coupled to the second electrode of the ninth transistor, and a control electrode coupled to the discharging control terminal; and a twelfth transistor having a first electrode coupled to the second electrode of the ninth transistor, a second electrode coupled to the second power supply, and a control electrode coupled to the discharging control terminal.

15. The shift register according to claim 12, wherein the pull-down control subcircuit comprises:

a thirteenth transistor having a first electrode coupled to the first power supply, a second electrode coupled to the pull-down node, and a control electrode coupled to the first electrode of the thirteenth transistor; and a fourteenth transistor having a first electrode coupled to the second electrode of the thirteenth transistor, a second electrode coupled to the second power supply, and a control electrode coupled to the pull-up node.

16. The shift register according to claim 12, wherein the first pull-down subcircuit comprises:

a fifteenth transistor having a first electrode coupled to the pull-up node, a second electrode coupled to the second electrode of the ninth transistor, and a control electrode coupled to the pull-down node;

a sixteenth transistor having a first electrode coupled to the second electrode of the ninth transistor, a second electrode coupled to the second power supply, and a control electrode coupled to the pull-down node; and a seventeenth transistor having a first electrode coupled to the cascade output terminal, a second electrode coupled to the second power supply, and a control electrode coupled to the pull-down node.

17. The shift register according to claim 12, wherein the second pull-down subcircuit comprises:

an eighteenth transistor having a first electrode coupled to the signal output terminal, a second electrode coupled to the second power supply, and a control electrode coupled to the pull-down node.

18. A gate driving circuit comprising N stages of cascaded shift registers according to claim 1, wherein a first control terminal of an $n^{th}$ stage of shift register is coupled to a cascade output terminal of an $(n-2)^{th}$ stage of shift register, and a discharging control terminal of the $n^{th}$ stage of shift register is coupled to a cascade output terminal of an $(n+3)^{th}$ stage of shift register, wherein N is a natural number, and n is a natural number greater than 2 and less than or equal to N−3.

19. A display panel comprising the gate driving circuit according to claim 18.

20. A method of driving a shift register, comprising steps of:

in a display mode, writing, by a display control circuit, a level provided at a first power supply of the shift register into a pull-up node of the shift register under control of a first control signal at a first control terminal of the shift register;

controlling, by a cascade output circuit, a cascade output terminal of the shift register to output a cascade control signal according to a level at the pull-up node and a second clock signal at a second clock terminal of the shift register;

controlling, by a signal output circuit, a signal output terminal of the shift register to output a gate driving signal according to the level at the pull-up node and a first clock signal at a first clock terminal of the shift register; and controlling, by a sensing control circuit, a level at a holding node according to a second control signal at a second control terminal of the shift register and the cascade control signal at the cascade output terminal; and in a sensing mode, controlling, by the sensing control circuit, the level at the pull-up node according to the level at the holding node and a third control signal at a third control terminal of the shift register; and controlling, by the signal output circuit, the signal output terminal to output a sensing driving signal according to the level at the pull-up node and the first clock signal at the first clock terminal.

* * * * *